US010510658B2

United States Patent
Lee et al.

(10) Patent No.: US 10,510,658 B2
(45) Date of Patent: Dec. 17, 2019

(54) SEMICONDUCTOR DEVICES

(71) Applicant: Samsung Electronics Co., Ltd., Suwon-si (KR)

(72) Inventors: Eui Bok Lee, Seoul (KR); Deok Young Jung, Seoul (KR); Sang Bom Kang, Seoul (KR); Doo-Hwan Park, Yongin-si (KR); Jong Min Baek, Seoul (KR); Sang Hoon Ahn, Hwaseong-si (KR); Hyeok Sang Oh, Suwon-si (KR); Woo Kyung You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/039,838

(22) Filed: Jul. 19, 2018

(65) Prior Publication Data

US 2019/0181088 A1 Jun. 13, 2019

(30) Foreign Application Priority Data

Dec. 7, 2017 (KR) ........................ 10-2017-0167399

(51) Int. Cl.
   *H01L 23/48* (2006.01)
   *H01L 23/522* (2006.01)
   (Continued)

(52) U.S. Cl.
   CPC .... *H01L 23/5226* (2013.01); *H01L 21/76804* (2013.01); *H01L 21/76831* (2013.01); *H01L 21/76843* (2013.01); *H01L 23/5283* (2013.01)

(58) Field of Classification Search
   CPC ............ H01L 23/5226; H01L 23/5283; H01L 21/76804; H01L 21/76831; H01L 21/76843
   (Continued)

(56) References Cited

U.S. PATENT DOCUMENTS

| 5,888,866 A | 3/1999 | Chien |
| 6,914,320 B2 | 7/2005 | Chen |

(Continued)

FOREIGN PATENT DOCUMENTS

| KR | 100333540 | 4/2002 |
| KR | 100447322 | 8/2004 |

(Continued)

*Primary Examiner* — Tu-Tu V Ho
(74) *Attorney, Agent, or Firm* — Myers Bigel, P.A.

(57) ABSTRACT

Semiconductor devices are provided. The semiconductor devices may include a substrate, a first insulating film on the substrate, a lower metal layer in the first insulating film, and a second insulating film on the first insulating film. The lower metal layer may be in the second insulating film, the second insulating film may include a lower surface facing the substrate and an upper surface that is opposite the lower surface, and the upper surface of the second insulating film may be upwardly convex. The semiconductor devices may further include a barrier dielectric film including a recess on the second insulating film, and a via metal layer that is in the recess of the barrier dielectric film and electrically connected with the lower metal layer. The first insulating film and the second insulating film may be sequentially stacked on the substrate in a vertical direction, and a longest vertical distance between an upper surface of the lower metal layer and the substrate may be less than a longest vertical distance between the upper surface of the second insulating film and the substrate.

20 Claims, 15 Drawing Sheets

(51) Int. Cl.
*H01L 21/768* (2006.01)
*H01L 23/528* (2006.01)

(58) Field of Classification Search
USPC .......................................................... 257/758
See application file for complete search history.

(56) References Cited

U.S. PATENT DOCUMENTS

| | | |
|---|---|---|
| 7,224,068 B2 | 5/2007 | Tseng |
| 7,687,877 B2 | 3/2010 | Yang |
| 9,064,872 B2 | 6/2015 | Boyanov |
| 9,165,883 B2 | 10/2015 | Vannier |
| 9,324,650 B2 | 4/2016 | Edelstein |
| 9,334,572 B2 | 5/2016 | Ou |
| 9,368,590 B2 | 6/2016 | Fan |
| 9,583,429 B2 | 2/2017 | Sung |
| 2013/0207269 A1* | 8/2013 | Oshida .............. H01L 21/31116 257/762 |
| 2014/0312508 A1* | 10/2014 | Boyanov ............. H01L 23/5329 257/774 |
| 2016/0190009 A1 | 6/2016 | Wallace |
| 2017/0092533 A1 | 3/2017 | Chakraborty |
| 2017/0278796 A1* | 9/2017 | Briggs .............. H01L 23/53295 |

FOREIGN PATENT DOCUMENTS

| | | |
|---|---|---|
| KR | 20050028617 | 3/2005 |
| KR | 20050031302 | 4/2005 |
| KR | 100914391 | 8/2009 |

* cited by examiner

SEMICONDUCTOR DEVICES

CROSS-REFERENCE TO RELATED APPLICATION

This U.S. non-provisional patent application claims priority under 35 U.S.C. § 119 to Korean Patent Application No. 10-2017-0167399, filed on Dec. 7, 2017 in the Korean Intellectual Property Office, the disclosure of which is incorporated herein in its entirety by reference.

BACKGROUND

The present disclosure generally relates to the field of electronics and, more particularly, to semiconductor devices.

As down-scaling of a semiconductor device is accelerated with the development of the electronics industry, high-density and low-power consuming semiconductor chips may be beneficial.

To manufacture high-density and low-power consuming semiconductor devices, decreasing sizes of elements (e.g., transistors, conductive lines) included in the semiconductor devices and decreasing a dielectric constant k of an inter-metal insulating film (e.g., an insulating layer between conductive elements) used at a back end-of-line (BEOL) process, while enhancing resistance capacitance and reliability of a dielectric film between conductive elements (e.g., conductive wires), may be desirable.

SUMMARY

Some embodiments of the present inventive concepts provide semiconductor devices having reliability of an electrical connection between a via metal layer and a lower metal layer.

Some embodiments of the present inventive concepts provide semiconductor devices having reliability by reducing an electrical short between a via metal layer and a lower metal layer that should be electrically isolated from the via metal layer.

According to some embodiments of the present inventive concepts, semiconductor devices may include a substrate, a first insulating film on the substrate, a lower metal layer in the first insulating film, and a second insulating film on the first insulating film. The lower metal layer may be in the second insulating film, the second insulating film may include a lower surface facing the substrate and an upper surface that is opposite the lower surface, and the upper surface of the second insulating film may be upwardly convex. The semiconductor devices may further include a barrier dielectric film including a recess on the second insulating film, and a via metal layer that is in the recess of the barrier dielectric film and electrically connected with the lower metal layer. The first insulating film and the second insulating film may be sequentially stacked on the substrate in a vertical direction, and a longest vertical distance between an upper surface of the lower metal layer and the substrate may be less than a longest vertical distance between the upper surface of the second insulating film and the substrate.

According to some embodiments of the present inventive concepts, semiconductor devices may include a substrate, a first insulating film on the substrate, a first lower metal layer in the first insulating film, a second lower metal layer that is in the first insulating film and is spaced apart from the first lower metal layer in a horizontal direction, a second insulating film that is on the first insulating film and is on both a side of the first lower metal layer and a side of the second lower metal layer, and a via metal layer that is on the first lower metal layer and electrically connected with the first lower metal layer. A longest vertical distance between an upper surface of each of the first and second lower metal layers and the substrate may be less than a longest vertical distance between an upper surface of the second insulating film and the substrate.

According to some embodiments of the present inventive concepts, semiconductor devices may include a substrate, a first insulating film on the substrate, a lower metal layer in the first insulating film, and a second insulating film on the first insulating film. The second insulating film may include a lower surface facing the substrate and an upper surface that is opposite the lower surface, and the upper surface of the second insulating film may be upwardly convex. The semiconductor devices may further include a barrier dielectric film on the second insulating film, a third insulating film including a recess on the barrier dielectric film, and a via metal layer that is in the recess of the third insulating film and is electrically connected with the lower metal layer. The first insulating film and the second insulating film may be sequentially stacked on the substrate in a vertical direction. A longest vertical distance between an upper surface of the lower metal layer and the substrate may be less than a longest vertical distance between the upper surface of the second insulating film and the substrate.

It will be understood that the present disclosure is not limited to example embodiments mentioned above.

BRIEF DESCRIPTION OF THE DRAWINGS

The above and other objects, features and advantages of the present disclosure will become more apparent to those of ordinary skill in the art by describing in detail embodiments thereof with reference to the accompanying drawings, in which.

DETAILED DESCRIPTION

As used herein the term "and/or" includes any and all combinations of one or more of the associated listed items. It will be understand that "side", "side surface," and "sidewall" are interchangeable terms.

Hereinbelow, semiconductor devices according to some embodiments of the present disclosure will be described with reference to FIGS. 1 through 5.

Figure 1:
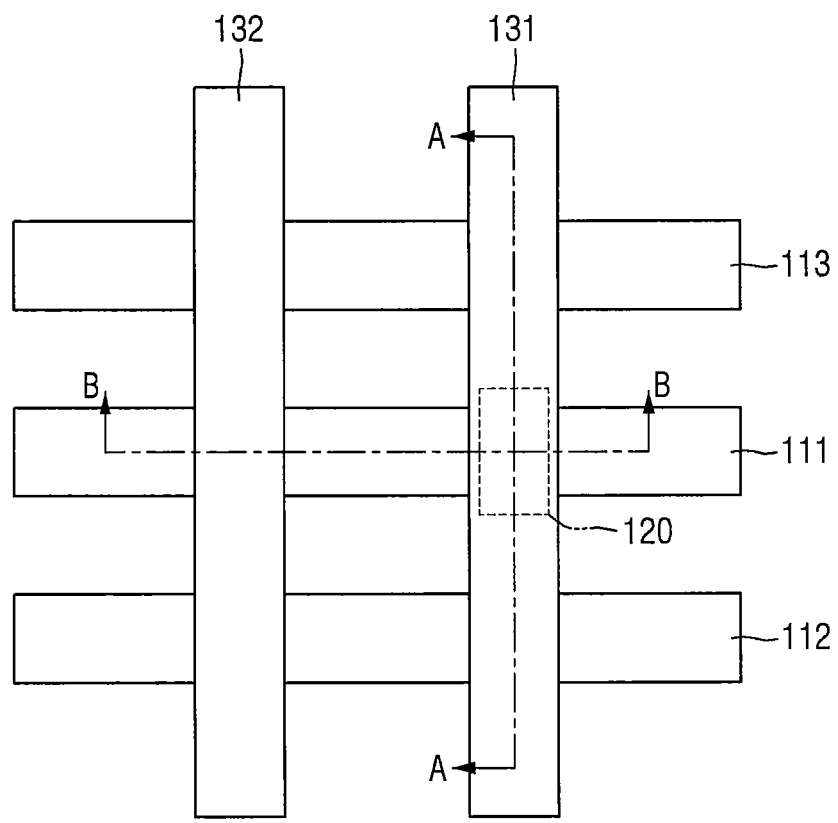
FIG. 1 is a layout provided to explain a semiconductor device according to example embodiments of the present inventive concepts.
Figure 2:
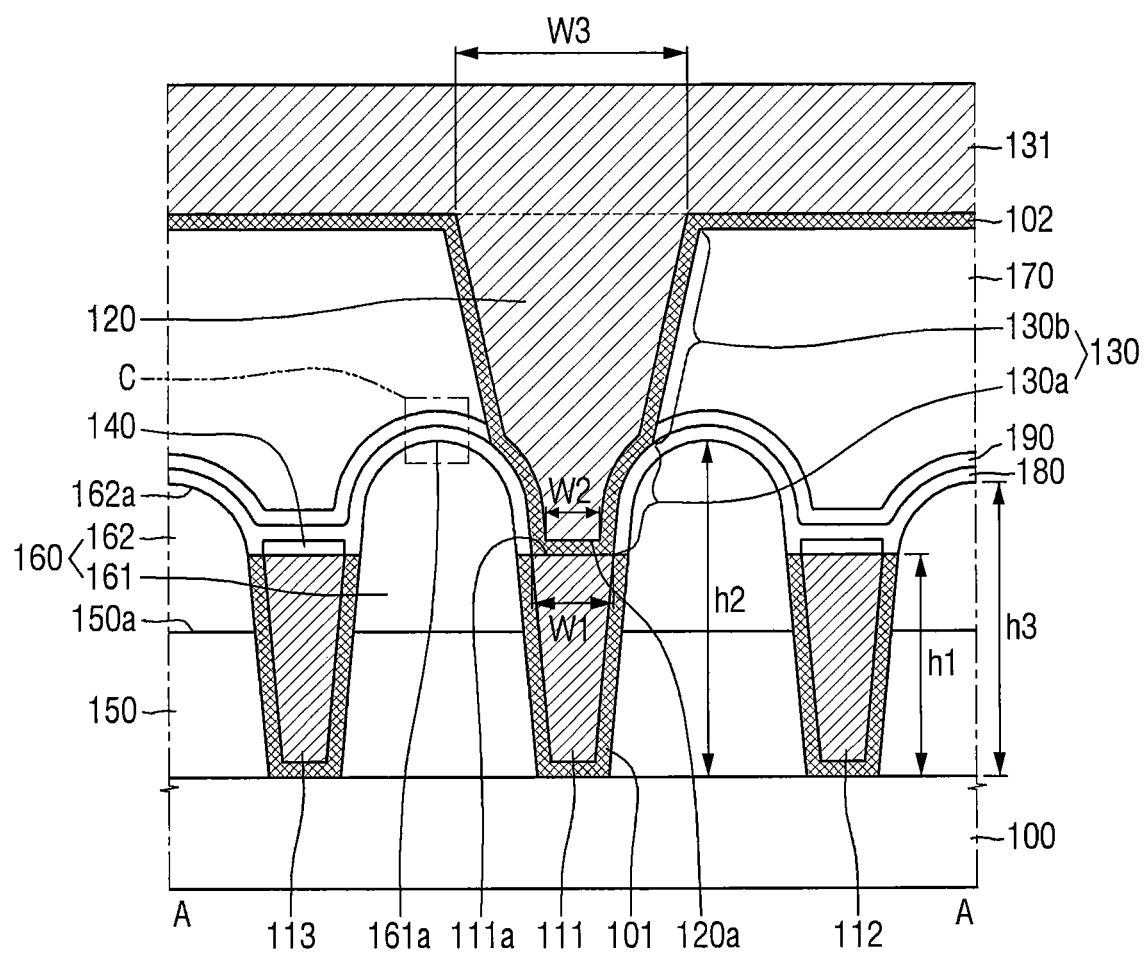
FIG. 2 is a cross-sectional view taken along the line A-A of FIG. 1 according to example embodiments of the present inventive concepts.
Figure 3:
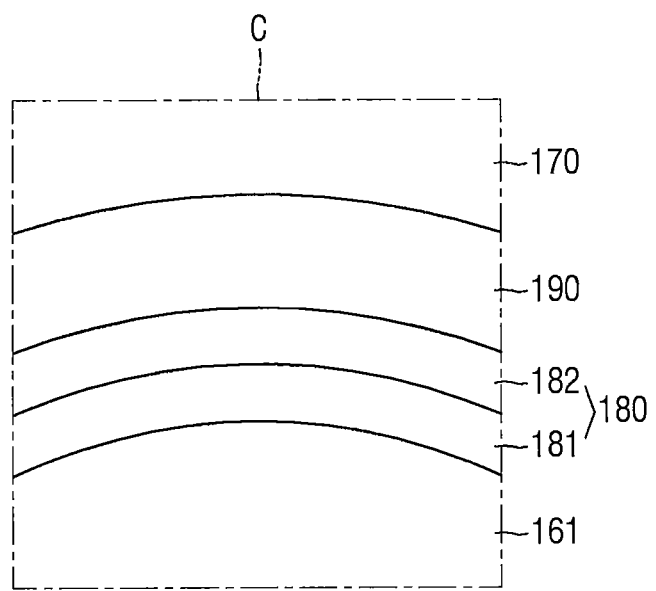
FIGS. 3 and 4 are cross-sectional views of the portion C of FIG. 2 according to example embodiments of the present inventive concepts.
Figure 4:
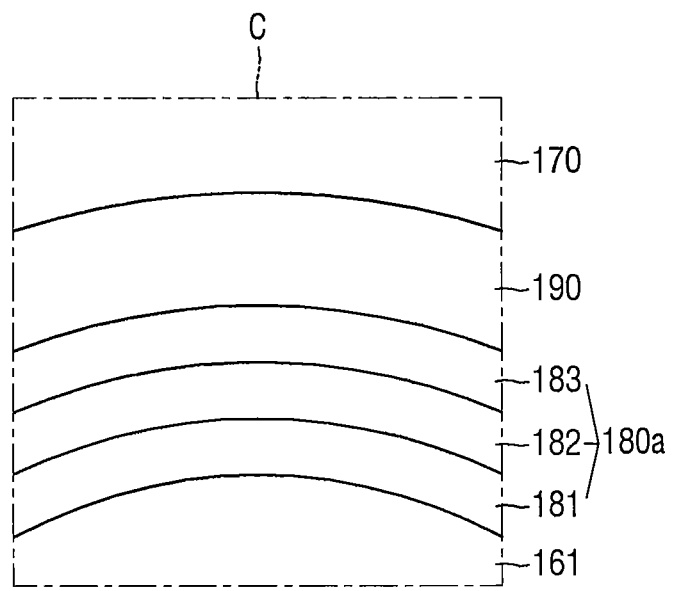
Figure 5:
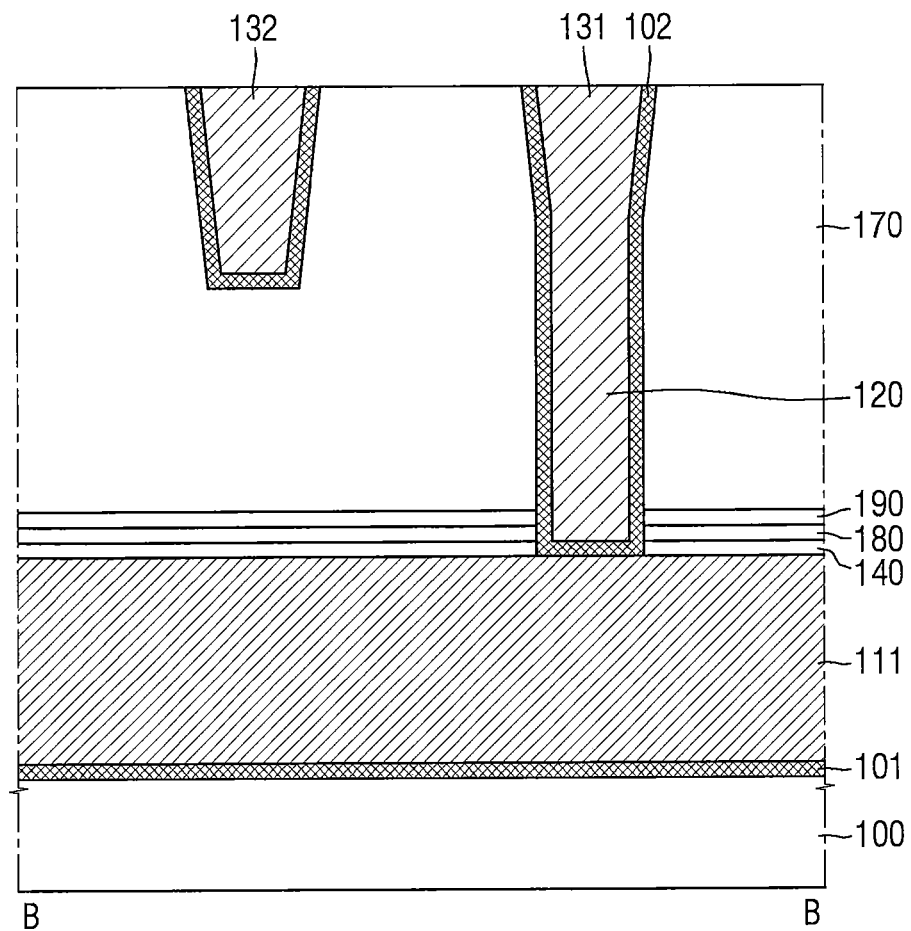
FIG. 5 is a cross-sectional view taken along the line B-B of FIG. 1 according to example embodiments of the present inventive concepts.

FIG. 1 is a layout provided to explain a semiconductor device according to some embodiments. FIG. 2 is a cross-sectional view taken along the line A-A of FIG. 1. FIGS. 3 and 4 are cross-sectional views of the portion C of FIG. 2. FIG. 5 is a cross-sectional view taken on the line B-B of FIG. 1.

Referring to FIGS. 1 to 5, the semiconductor devices according to some embodiments may include a substrate 100, a lower barrier film 101, a first lower metal layer 111, a second lower metal layer 112, a third lower metal layer 113, a via metal layer 120, an upper barrier film 102, a first upper metal layer 131, a second upper metal layer 132, a capping film 140, a first insulating film 150, a second insulating film 160, a third insulating film 170, a barrier dielectric film 180, and an adhesive film 190.

In some embodiments, the substrate 100 may have a structure in which a base substrate and an epitaxial layer are stacked, although the present disclosure is not limited thereto. In some embodiments, for example, the substrate 100 may be a silicon substrate, a gallium arsenide substrate, a silicon germanium substrate, a ceramic substrate, a quartz substrate, or a glass substrate for display or may be a semiconductor on insulator (SOI) substrate.

For example, when the substrate 100 includes a silicon substrate, the substrate 100 may include an insulating film formed on the silicon substrate.

Further, although not illustrated, the substrate 100 may include a conductive pattern. The conductive pattern may be, for example, a metal wire or a contact or may be a gate electrode of a transistor, a source/drain region of a transistor, or a diode. However, the conductive pattern of the present disclosure is not limited thereto.

The first insulating film 150 may be on the substrate 100. The first insulating film 150 may include, for example, silicon oxide, silicon nitride, silicon oxynitride, and/or low-k dielectric material.

For example, the first insulating film 150 may include a low-k dielectric material to alleviate the coupling phenomenon between wires (e.g., conductive patterns). The low-k dielectric material may be, for example, silicon oxide including carbon or hydrogen (e.g., carbon and hydrogen with high concentrations). For example, the first insulating film 150 may be or may include SiCOH.

A dielectric constant of an insulating material may be lowered by an addition of carbon into the insulating material. In some embodiments, in order to further lower the dielectric constant of the insulating material, the insulating material may include, within the insulating material, pore(s) such as cavities. In some embodiments, gas or air may be in the pore(s).

The low-k dielectric material may be or may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), a low-k organic polymer (e.g., SiLK™), amorphous fluorinated carbon, silica aerogels, silica xerogels, mesoporous silica or a combination thereof. However, the low-k dielectric material of the present disclosure is not limited materials listed herein.

In some embodiments, the first insulating film 150 may include a low-k dielectric insulating material having a dielectric constant lower than a dielectric constant of silicon oxide.

The first to third lower metal layers 111, 112, 113 may be on the substrate 100. In some embodiments, first, second, and third lower metal layers 111, 112, 113 may be spaced apart from each other in a horizontal direction as illustrated in FIG. 2. The first to third lower metal layers 111, 112, 113 may be in the first insulating film 150. In some embodiments, each of the first to third lower metal layers 111, 112, 113 may extend through (e.g., penetrate through) the first insulating film 150 as illustrated in FIG. 2.

In some embodiments, each of the first to third lower metal layers 111, 112, 113 may extend longitudinally in a first horizontal direction (e.g., a first direction X of FIG. 2). In some embodiments, the second lower metal layer 112, the first lower metal layer 111, and the third lower metal layer 113 may be spaced apart from one another in a second horizontal direction (e.g., a second direction Y of FIG. 2) and may be sequentially arranged along the second horizontal direction.

It will be understood that arrangements of the first to third lower metal layers 111, 112, 113 are provided herein only for convenience of explanation/description, and, in some embodiments, the arrangements of the first to third lower metal layers 111, 112, 113 may vary and are not limited to those described/illustrated herein.

Each of the first to third lower metal layers 111, 112, 113 may include, for example, at least one of aluminum (Al), copper (Cu), tungsten (W), and cobalt (Co). In some embodiments, the first to third lower metal layers 111, 112, 113 may include aluminum (Al), copper (Cu), tungsten (W), and/or cobalt (Co).

In some embodiments, each of the first to third lower metal layers 111, 112, 113 includes copper (Cu), and the copper (Cu) included in each of the first to third lower metal layers 111, 112, 113 may include, for example, carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), aluminum (Al), molybdenum (Mo), ruthenium (Ru), and/or zirconium (Zr).

FIG. 2 illustrates an upper surface of each of the first to third lower metal layers 111, 112, 113 being planar, but this is provided only for convenience of explanation, and the present disclosure is not limited thereto. That is, in some embodiments, the upper surface of each of the first to third lower metal layers 111, 112, 113 may be upwardly or downwardly convex.

The lower barrier film 101 may be disposed between each of the first to third lower metal layers 111, 112, 113 and the first insulating film 150.

The lower barrier film 101 may be disposed along a bottom surface and a sidewall of the first lower metal layer 111. The lower barrier film 101 may be disposed along a bottom surface and sidewalls of the second lower metal layer 112. The lower barrier film 101 may be disposed along a bottom surface and sidewalls of the third lower metal layer 113. In some embodiments, one of the lower barrier films 101 may extend along the bottom surface and the sidewall of each of the first, second, and third lower metal layers 111, 112, 113 as illustrated in FIG. 2.

The lower barrier film 101 may include, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir) and/or rhodium (Rh).

One of the upper surfaces 111a of each of the first to third lower metal layers 111, 112, 113 may be higher than an upper surface 150a of the first insulating film 150. To this end, a portion of the lower barrier film 101 disposed on the sidewall of each of the first to third lower metal layers 111, 112, 113 may be exposed by the first insulating film 150.

In some embodiments, as illustrated in FIG. 2, a vertical distance (i.e., a distance in a third direction Z) between one of the upper surfaces 111a of each of the first to third lower metal layers 111, 112, 113 and the substrate 100 (e.g., an upper surface of the substrate) may be greater than a vertical distance between the upper surface 150a of the first insulating film 150 and the substrate 100. In some embodiments, as illustrated in FIG. 2, an upper portion of each of the lower barrier films 101 may extend beyond the upper surface 150a of the first insulating film 150, and thus the upper portions of the lower barrier films 101 may be exposed by the first insulating film 150.

The second insulating film 160 may be on the first insulating film 150. In some embodiments, the upper portions of the lower barrier films 101 exposed by the first insulating film 150 may be in the second insulating film 160. In some embodiments, the second insulating film 160 may be on, and in some embodiments, may surround, side surfaces of upper portions of the first to third lower metal layers 111, 112, 113 extending beyond the upper surface 150a of the first insulating film 150.

The second insulating film 160 may include a first portion 161 disposed between the first lower metal layer 111 and the second lower metal layer 112 and between the first lower metal layer 111 and the third lower metal layer 113. In addition, the second insulating film 160 may include a second portion 162 in a region on the first insulating film 150 other than a region in which the first portion 161 is disposed.

The first portion 161 of the second insulating film 160 may be on a first side of the second lower metal layer 112 that faces the first lower metal layer 111, and on a first side of the third lower metal layer 113 that faces the first lower metal layer 111. The second portion 162 of the second insulating film 160 may be disposed on a second side of the second lower metal layer 112 opposite the first side of the second lower metal layer 112, and on a second side of the third lower metal layer 113 opposite the first side of the third lower metal layer 113.

In some embodiments, as illustrated in FIG. 2, the first portions 161 of the second insulating film 160 may be between the second lower metal layer 112 and the first lower metal layer 111 and between the third lower metal layer 113 and the first lower metal layer 111, and one of the second portions 162 of the second insulating film 160 may be on an opposite side of one of the first portions 161 of the second insulating film 160 with respect to one of the second lower metal layer 112 and the third lower metal layer 113.

The second insulating film 160 may not be formed on the upper surface 111a of each of the first to third lower metal layers 111, 112, 113. However, the present disclosure is not limited thereto. That is, in some embodiments, a portion of the second insulating film 160 may be disposed on the upper surface 111a of each of the first to third lower metal layers 111, 112, 113.

In some embodiments, each of upper surfaces 161a, 162a of the second insulating films 160 may be convex in a third direction Z (e.g., upwardly convex). The upper surface 161a of the first portion 161 of the second insulating film 160 may be formed to be convex in the opposite direction of a direction in which the substrate 100 is positioned, (e.g., in the third direction Z of FIG. 2). The upper surface 162a of the second portion 162 of the second insulating film 160 may be formed to be convex in the opposite direction of the direction in which the substrate 100 is positioned (e.g., in the third direction Z of FIG. 2). In some embodiments, each of upper surfaces 161a, 162a of the first portion 161 and the second portion 162 of the second insulating film 160 may be upwardly convex, as illustrated in FIG. 2.

The upper surface 111a of each of the first to third lower metal layers 111, 112, 113 may be closer to the substrate 100 (e.g., an upper surface of the substrate 100) than an upper surface of the upper surface 161a, 162a of the second insulating film 160.

A height h2 from the substrate 100 to the upper surface 161a of the first portion 161 of the second insulating film 160 may be higher than a height h1 from the substrate 100 to the upper surface 111a of each of the first to third lower metal layers 111, 112, 113. A height h3 from the substrate 100 to the upper surface 162a of the second portion 162 of the second insulating film 160 may be higher than the height h1 from the substrate 100 to the upper surface 111a of each of the first to third lower metal layers 111, 112, 113. In some embodiments, as illustrated in FIG. 2, a longest vertical distance h2 between the upper surface 161a of the first portion 161 of the second insulating film 160 and the substrate 100 may be greater than a longest vertical distance h1 between the upper surface 111a of each of the first to third lower metal layers 111, 112, 113 and the substrate 100. It will be understood that "a vertical distance" refers to a distance in a vertical direction (e.g., the third direction Z).

The upper surface 162a of the second portion 162 of the second insulating film 160 may be closer to the substrate 100 than the upper surface 161a of the first portion 161 of the second insulating film 160.

The height h2 from the substrate 100 to the upper surface 161a of the first portion 161 of the second insulating film 160 may be higher than the height h3 from the substrate 100 to the upper surface 162a of the second portion 162 of the second insulating film 160. In some embodiments, as illustrated in FIG. 2, the longest vertical distance h2 between the upper surface 161a of the first portion 161 of the second insulating film 160 and the substrate 100 may be greater than a longest vertical distance h3 between the upper surface 162a of the second portion 162 of the second insulating film 160.

The capping film 140 may be disposed on the upper surface 111a of each of the first to third lower metal layers 111, 112, 113. The capping film 140 may be extended along the upper surface 111a of each of the first to third lower metal layers 111, 112, 113 and may extend in the first direction X.

As shown in FIGS. 2 and 5, the capping film 140 may not be formed on a portion of the upper surface 111a of the first lower metal layer 111 on which the via metal layer 120 is formed. That is, the capping film 140 may not be disposed between the first lower metal layer 111 and the via metal layer 120, and, in some embodiments, the capping film 140 may not be disposed between the first lower metal layer 111 and the upper barrier film 102.

The present disclosure is not limited thereto. That is, in some embodiments, the capping film 140 may be disposed between the first lower metal layer 111 and the via metal layer 120.

For example, the capping film 140 may be or may include cobalt (Co), tungsten (W), aluminum (Al), tantalum (Ta), titanium (Ti), nickel (Ni), ruthenium (Ru), and/or aluminum nitride (AlN).

The barrier dielectric film 180 may be disposed on the second insulating film 160, the capping film 140, and the first to third lower metal layers 111, 112, 113. In some embodiments, the barrier dielectric film 180 may extend conformally as illustrated in FIG. 2. However, the present disclosure is not limited thereto, and the barrier dielectric film 180 may have a shape different from the shape illustrated in FIG. 2.

The barrier dielectric film 180 may not be on a portion of the upper surface 111a of the first lower metal layer 111 on which the via metal layer 120 is formed. In some embodiments, the barrier dielectric film 180 may not be between the first lower metal layer 111 and the via metal layer 120, as illustrated in FIG. 2.

The barrier dielectric film 180 may be disposed to surround a portion of the via metal layer 120. Specifically, the barrier dielectric film 180 may be exposed to a lower sidewall 130a of a recess 130 and may surround the via metal layer 120 between the lower sidewalls 130a of the recess 130.

In some embodiments, as illustrated in FIG. 2, a portion of the barrier dielectric film 180 may define a lower portion of a recess 130 (e.g., the lower sidewall 130a of the recess 130), and the portion of the barrier dielectric film 180 may be on (e.g., may extend along) a side of a lower portion of the via metal layer 120. In some embodiments, as illustrated in FIG. 2, the upper barrier film 102 may contact the portion of the barrier dielectric film 180 that defines the lower portion of the recess 130.

The barrier dielectric film 180 may include a first etching stop film 181 and an oxidation prevention film 182 as shown in FIG. 3. The oxidation prevention film 182 may inhibit, restrict, and/or hinder oxidation. Accordingly, it will be understood that the oxidation prevention film 182 may be referred to as "an oxidation inhibition film."

The first etching stop film 181 may be disposed on the second insulating film 160, the capping film 140, and the first to third lower metal layers 111, 112, 113. The first etching stop film 181 may not be formed between the first lower metal layer 111 and the via metal layer 120.

The first etching stop film 181 may be, for example, an aluminum nitride film. However, the first etching stop film 181 of the present disclosure is not limited to an aluminum nitride film.

The first etching stop film 181 may have an etching resistivity 50 times higher than that of the third insulating film 170 to be described later.

The oxidation prevention film 182 may be disposed on the first etching stop film 181. The oxidation prevention film 182 may not be formed between the first lower metal layer 111 and the via metal layer 120.

The oxidation prevention film 182 may be a film, for example, including a silicon oxide film, a silicon nitride film, and/or a carbon doped film. However, the oxidation prevention film 182 of the present disclosure is not limited to the films listed herein.

In some embodiments, the barrier dielectric film 180 may include the first etching stop film 181, the oxidation prevention film 182, and a second etching stop film 183 as shown in FIG. 4. That is, in some embodiments, the barrier dielectric film 180 may further include the second etching stop film 183 disposed on the oxidation prevention film 182.

The second etching stop film 183 may be, for example, an aluminum nitride film. However, the second etching stop film 183 of the present disclosure is not limited to an aluminum nitride film.

The adhesive film 190 may be on the barrier dielectric film 180. Specifically, the adhesive film 190 may be on the barrier dielectric film 180 except for a region on which the recess 130 is. The adhesive film 190 may extend conformally on the barrier dielectric film 180, but a shape of the adhesive film 190 of the present disclosure is not limited to the shape illustrated herein.

A sidewall of the adhesive film 190 may be exposed by the recess 130. The sidewall of the adhesive film 190 exposed by the recess 130 may be in contact with the upper barrier film 102.

The third insulating film 170 may be disposed on the adhesive film 190. Specifically, the third insulating film 170 may be disposed on the adhesive film 190 to surround a sidewall of the via metal layer 120. In some embodiments, the adhesive film 190 may be on a sidewall of the via metal layer 120 as illustrated in FIG. 2.

The third insulating film 170 may include a low-k dielectric material similar to that of the first insulating film 150 described above.

The recess 130 may be on the first lower metal layer 111. Specifically, the recess 130 may penetrate through the third insulating film 170 and expose the upper surface 111a of the first lower metal layer 111. A portion of the barrier dielectric film 180 and a portion of the first portion 161 of the second insulating film 160 may be formed to be dented inward the recess 130.

Referring to FIG. 2, in some embodiments, a portion of the barrier dielectric film 180 may include a curved surface defining the recess 130, and the curved surface of the portion of the barrier dielectric film 180 may be convex toward the recess 130. In some embodiments, a portion of the second insulating film 160 may include a curved surface facing the recess 130, and the curved surface of the portion of the second insulating film 160 may be convex toward the recess 130.

The sidewall of the recess 130 may have an inclined profile in which a width in the second direction Y increases as the sidewall of the recess 130 is farther away from the substrate 100. However, a shape of the recess 130 of the present disclosure is not limited thereto. In some embodiments, the sidewall of the recess 130 may not be perpendicular to the horizontal directions (i.e., the first direction X and the second direction Y), and a width of the recess 130 in the second direction Y may vary according to the third direction Z, as illustrated in FIG. 2. In particular, as illustrated in FIG. 2, a width of the recess 130 in the second direction Y may increase as a distance from the substrate 100 in the third direction Z increases.

The recess 130 may include an upper sidewall 130b and a lower sidewall 130a which have different inclined profiles from each other. Specifically, the upper sidewall 130b of the recess 130 may have an inclined profile of a straight line, whereas the lower sidewall 130a of the recess 130 may have an inclined profile of a curved line.

Referring to FIG. 2, in some embodiments, the upper sidewall 130b of the recess 130 may be straight, and the lower sidewall 130a of the recess 130 may be curved. In some embodiments, a portion of the third insulating film 170 may define an upper portion of the recess 130 (e.g., the upper sidewall 130b of the recess 130), and the upper barrier film 102 may contact the portion of the third insulating film 170 that defines the upper portion of the recess 130.

However, the inventive concepts of the present disclosure are not limited thereto. That is, in some embodiments, the upper sidewall 130b and the lower sidewall 130a of the recess 130 may have different shapes discussed herein and may have the same inclined profile.

The lower sidewall 130a of the recess 130 may have the inclined profile of the curved line due to a portion of the barrier dielectric film 180 and a portion of the first portion 161 of the second insulating film 160 which are dented inward the recess 130.

The via metal layer 120 may be in the recess 130. The via metal layer 120 may be electrically connected with the first lower metal layer 111. As illustrated in FIG. 2, in some embodiments, the upper barrier film 102 and the via metal layer 120 may fill the recess 130.

The via metal layer 120 may include, for example, aluminum (Al), copper (Cu), tungsten (W), and/or cobalt (Co).

A width W2 of a lower surface 120a of the via metal layer 120 in the second direction Y may be smaller than a width W1 of the upper surface 111a of the first lower metal layer 111 in the second direction Y. However, the inventive concepts of the present disclosure are not limited thereto.

A width W3 of an upper surface of the via metal layer 120 in the second direction Y may be greater than the width W1 of the upper surface 111a of the first lower metal layer 111 in the second direction Y and the width W2 of the lower surface 120a of the via metal layer 120 in the second direction Y. However, the inventive concepts of the present disclosure are not limited thereto. In some embodiments, as illustrated in FIG. 2, an uppermost portion of the via metal layer 120 that contacts the first upper metal layer 131 may have the width W3 in the second direction Y and the width W3 may be greater than the width W1 of the upper surface 111a of the first lower metal layer 111 in the second direction Y and the width W2 of the lower surface 120a of the via metal layer 120 in the second direction Y.

The first upper metal layer 131 may be disposed on the third insulting film 170 and the via metal layer 120 to be extended in the second direction Y. The first upper metal layer 131 may be electrically connected with the first lower metal layer 111 through the via metal layer 120.

The second upper metal layer 132 may be spaced apart from the first upper metal layer 131 on the third insulating film 170 in the first direction X and may be disposed to be extended in the second direction Y. In some embodiments, as illustrated in FIGS. 1 and 5, the second upper metal layer 132 may be in the third insulating film 170, may be spaced apart from the first upper metal layer 131 in the first direction X, and may extend longitudinally in the second direction Y.

Although the drawings depict that only the first upper metal layer 131 is connected with the first lower metal layer 111 through the via metal layer 120, this is merely for convenience of explanation, and the second upper metal layer 132 may also be electrically connected with another lower metal layer.

The upper barrier film 102 may be disposed along the bottom surface and the sidewalls 130a, 130b of the recess 130. Further, the upper barrier film 102 may be disposed between the first and second upper metal layers 131, 132 and the third insulating film 170. In some embodiments, the upper barrier film 102 may extend along the sidewalls of the first and second upper metal layers 131, 132 and the sidewall and the bottom surface of the via metal layer 120.

The semiconductor device according to some embodiments may include the second insulating film 160 that is formed by selectively growing the second insulating film 160 only on the first insulating film 150 and by inhibiting (e.g., preventing) forming of the second insulating film 160 on the lower metal layers 111, 112, 113, thereby improving reliability of an electric connection between the via metal layer 120 and the lower metal layer 111.

The semiconductor device according to some embodiments may include the second insulating film 160 and the barrier dielectric film 180 formed to be convex in the opposite direction of the direction in which the substrate 100 is positioned, such that a short can be inhibited (e.g., prevented) between the via metal layer 120 and the lower metal layers 112, 113, other than the lower metal layer 111 electrically connected with the via metal layer 120, and thus reliability of the semiconductor device can be improved. In some embodiments, as illustrated in FIG. 2, each of upper surfaces of the second insulating film 160 and the barrier dielectric film 180 may be upwardly convex.

Hereinbelow, methods of fabricating a semiconductor device according to some embodiments will be described with reference to FIGS. 6 to 10.

FIGS. 6 to 10 are cross-sectional views illustrating intermediate stages of fabrication, which are provided to explain a method of fabricating a semiconductor device according to some embodiments.

Figure 6:
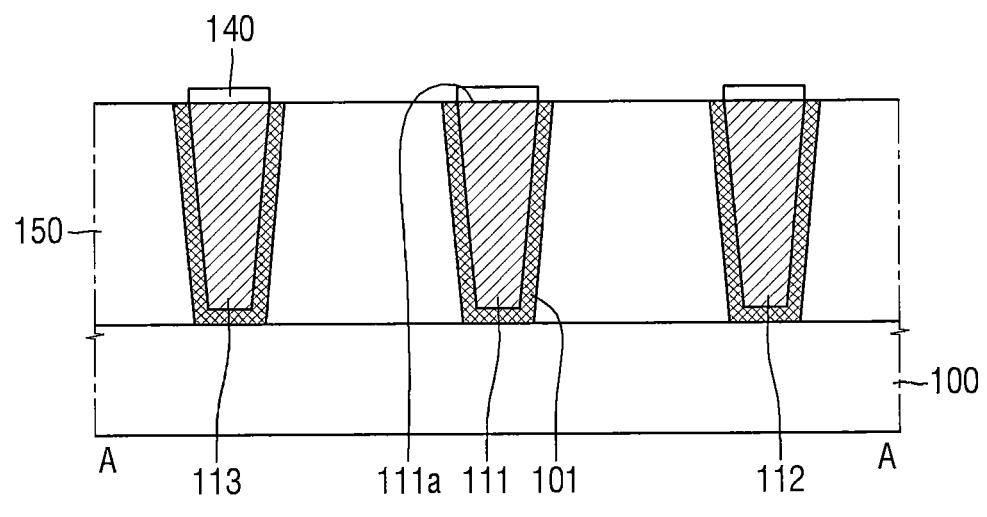
FIGS. 6 to 10 are cross-sectional views illustrating intermediate stages of fabrication, which area provided to explain a method for fabricating a semiconductor device according to example embodiments of the present inventive concepts.

Referring to FIG. 6, the first insulating film 150 may be formed on the substrate 100, and then, a plurality of recesses may be formed to penetrate through the first insulating film 150. Each of the recesses may extend longitudinally in the first direction X, and the recesses may be spaced apart from one another in the second direction Y.

The lower barrier films 101 may be formed along a bottom surface and sidewalls of each of the recesses. The lower barrier films 101 may be formed along an inner sidewall of each of the recesses as illustrated in FIG. 6. The first to third lower metal layers 111, 112, 113 may be formed in the recesses, respectively, and in some embodiments, the first to third lower metal layers 111, 112, 113 may be formed to fill the recesses, respectively.

The capping film 140 may be formed on the upper surface 111a of each of the first to third lower metal layers 111, 112, 113. In some embodiments, the capping film 140 may be formed only on the upper surface 111a of each of the first to third lower metal layers 111, 112, 113, as illustrated in FIG. 6. However, the present disclosure is not limited thereto.

Figure 7:
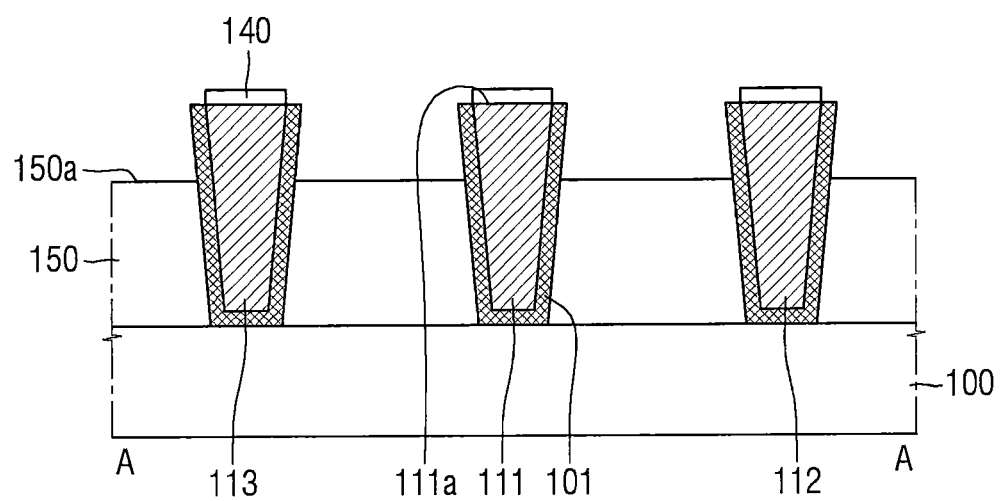

Referring to FIG. 7, a portion of the upper portion of the first insulating film 150 may be removed (e.g., etched). The upper surface 150a of the first insulating film 150 may be formed to be closer to the substrate 100 than the upper surface 111a of each of the first to third lower metal layers 111, 112, 113.

Figure 8:
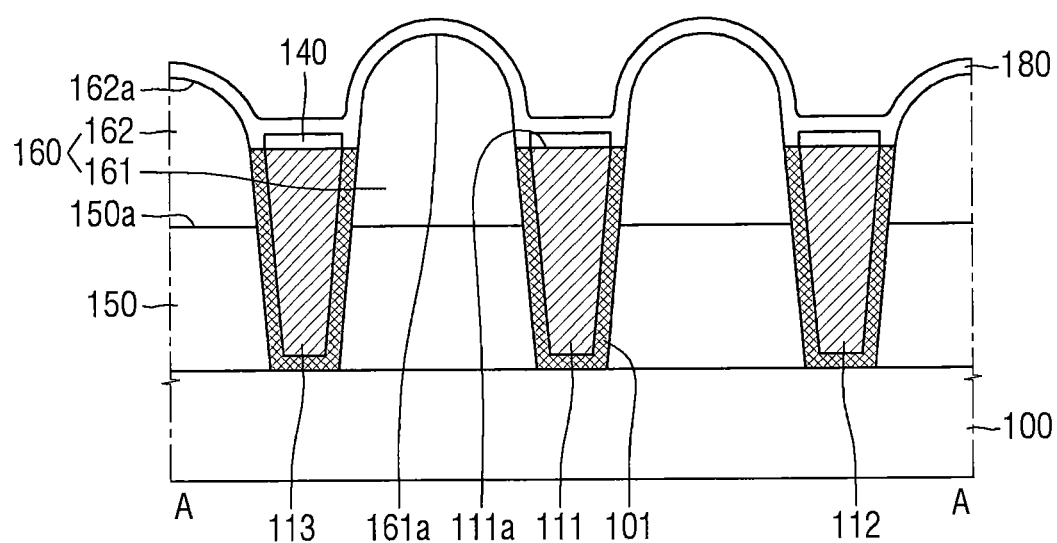

Referring to FIG. 8, the second insulating film 160 may be formed on the upper surface 150a of the first insulating film 150.

The second insulating film 160 may be selectively grown and formed only on the first insulating film 150. The second insulating film 160 may be formed on and, in some embodiments, may be formed to surround, side surfaces of the upper portion of each of the first to third lower metal layers 111, 112, 113.

The second insulating film 160 may not be formed on the upper surface 111a of each of the first to third lower metal layers 111, 112, 113. That is, the second insulating film 160 may be formed to avoid overlapping each of the first to third lower metal layers 111, 112, 113.

The second insulating film 160 may be formed to be convex in the opposite direction of the direction in which the substrate 100 is positioned. The first portion 161 of the second insulating film 160 may be formed to be more convex than the second portion 162 of the second insulating film 160. Specifically, the upper surface 162a of the second portion 162 of the second insulating film 160 may be formed to be closer to the substrate 100 than an upper surface of the upper surface 161a of the first portion 161 of the second insulating film 160.

The barrier dielectric film 180 may be formed on an upper surface of the lower barrier film 101, the capping film 140, and the second insulating film 160. In some embodiments, the barrier dielectric film 180 may be conformally formed, as illustrated in FIG. 8, although the inventive concepts of the present disclosure are not limited thereto.

The barrier dielectric film 180 may be formed by forming the first etching stop film 181 and the oxidation prevention film 182 being stacked in sequence as shown in FIG. 3.

Figure 9:
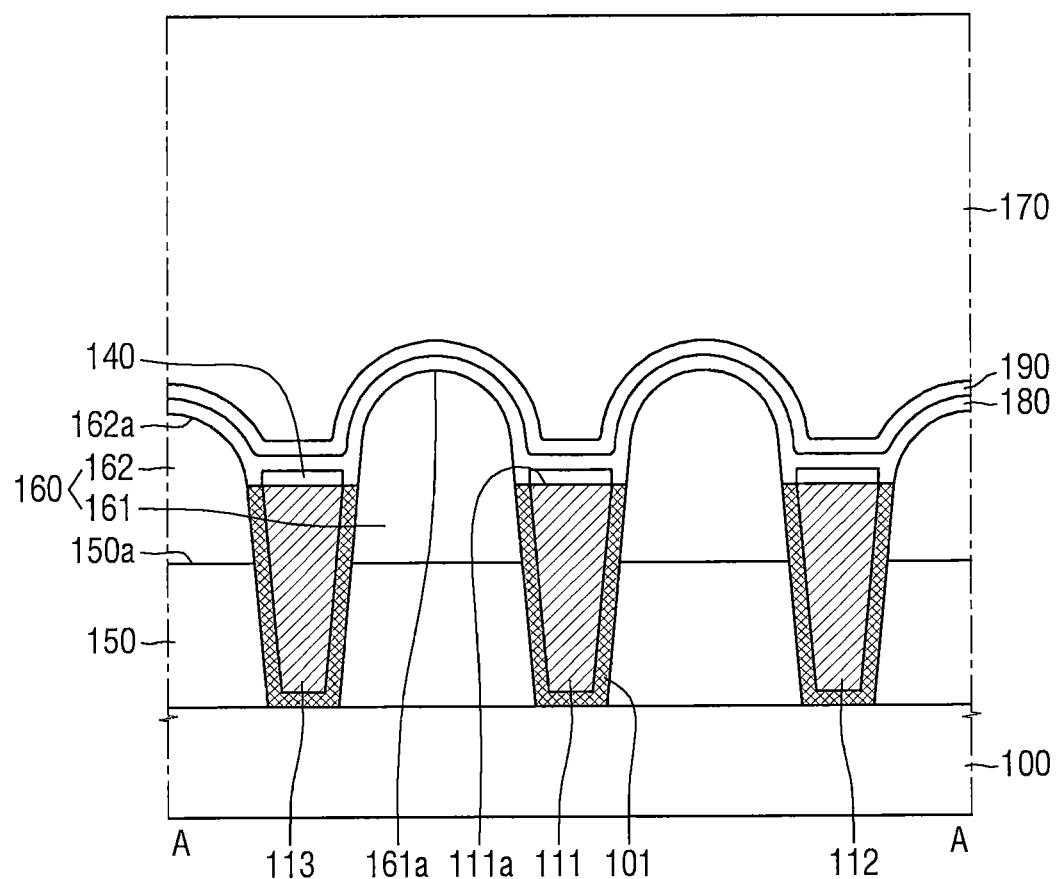

Referring to FIG. 9, the adhesive film 190 may be formed on the barrier dielectric film 180. In some embodiments, the adhesive film 190 may be conformally formed, as illustrated in FIG. 9, although the inventive concepts of the present disclosure are not limited thereto. Next, the third insulating film 170 may be formed on the adhesive film 190.

Figure 10:
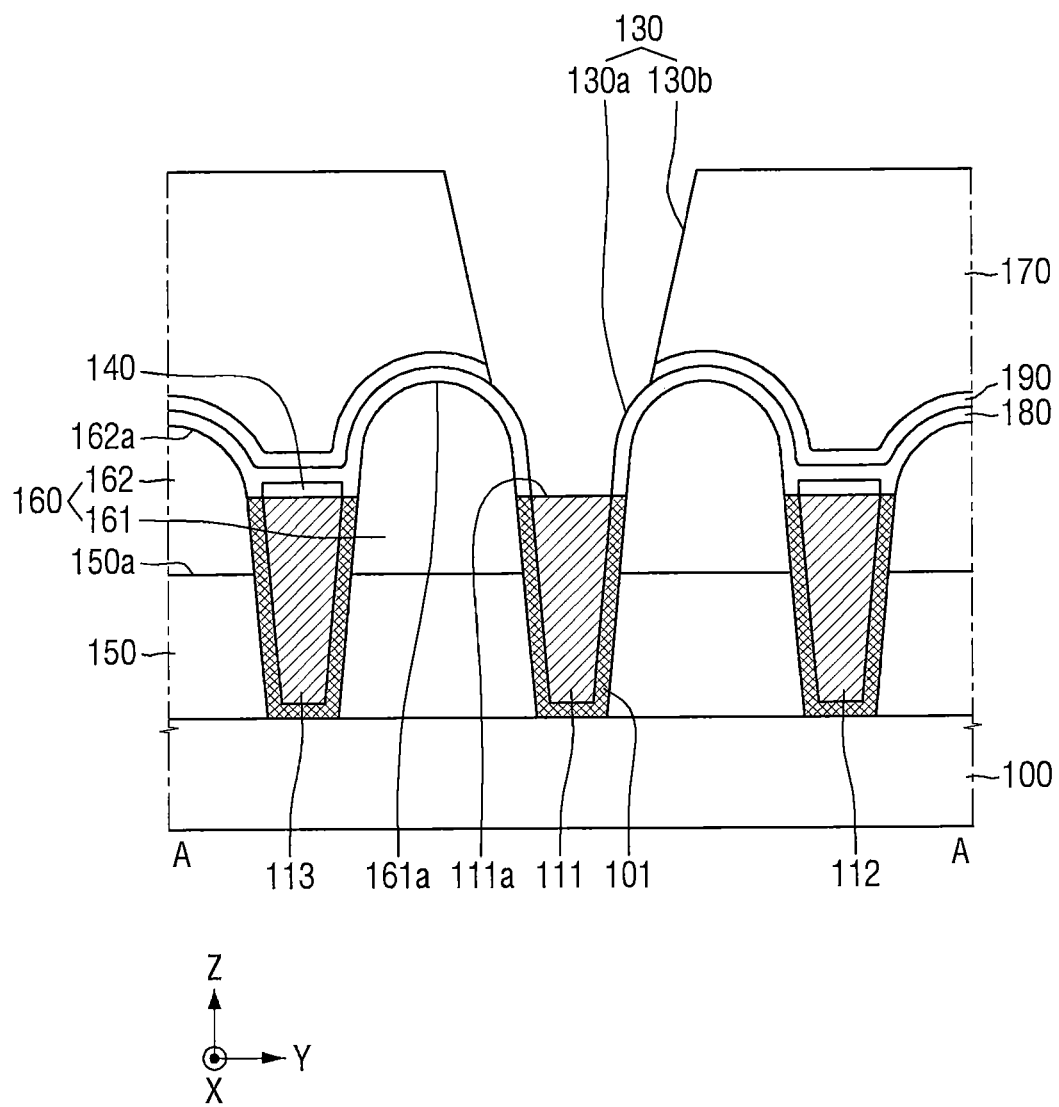

Referring to FIG. 10, the recess 130 penetrating through the third insulating film 170 may be formed by etching the third insulating film 170. In some embodiments, the adhesive film 190, the barrier dielectric film 180, and the capping film 140 formed on the first lower metal layer 111 may be etched in sequence, such that the upper surface 111a of the first lower metal layer 111 can be exposed.

In addition, a portion of the side surface of the adhesive film 190 and a portion of the barrier dielectric film 180 may be exposed to the recess 130.

Although FIG. 10 depicts that the barrier dielectric film 180 exposed to the sidewall of the recess 130 is not etched for convenience of explanation, in some embodiments, the barrier dielectric film 180 exposed to the sidewall of the recess 130 may be removed (e.g., etched) in part at the recess 130 forming process (e.g., while forming the recess 130).

In addition, although FIG. 10 depicts that the capping film 140 formed on the first lower metal layer 111 is etched at the recess 130 forming process (e.g., while forming the recess 130), the inventive concepts of the present disclosure are not limited thereto. That is, in some embodiments, the capping film 140 may not be etched at the recess 130 forming process.

Referring again to FIG. 2, the upper barrier film 102 may be formed on the bottom surface of the recess 130, the lower sidewall 130a, the upper sidewall 130b, and the upper surface of the third insulating film 170. The upper barrier film 102 may be conformally formed, although the inventive concepts of the present disclosure are not limited thereto.

The via metal layer 120 may be formed on the upper barrier film 102 to be in or to fill the recess 130. In addition, the first upper metal layer 131 may be formed on the via metal layer 120 and the upper barrier film 102 that is formed on the upper surface of the third insulating film 170.

The via metal layer 120 and the first upper metal layer 131 may be formed by the same process. However, the inventive concepts of the present disclosure are not limited thereto. That is, in some embodiments, the via metal layer 120 and the first upper metal layer 131 may be formed by different processes (e.g., formed by separate unit processes).

Through the above-described fabrication methods, the semiconductor device illustrated in FIG. 2 may be fabricated.

Hereinbelow, a semiconductor device according to some embodiments will be described with reference to FIG. 11. Differences from the semiconductor device illustrated in FIG. 2 will be highlighted.

Figure 11:
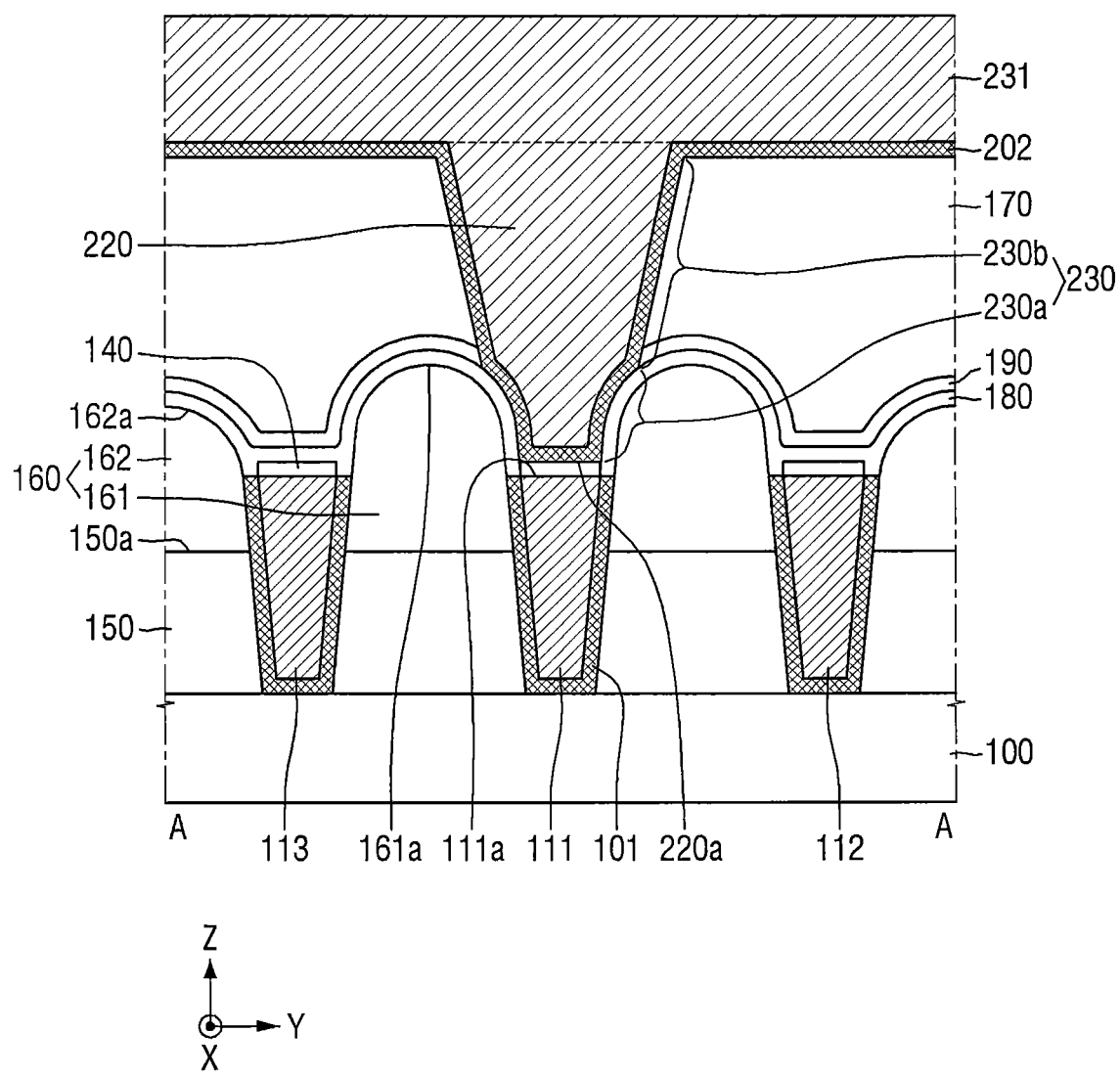
FIG. 11 is a cross-sectional view provided to explain a semiconductor device according to example embodiments of the present.

FIG. 11 is a cross-sectional view provided to explain a semiconductor device according to some embodiments.

Referring to FIG. 11, the semiconductor device according to some embodiments may include the capping film 140 that is between the upper surface 111a of the first lower metal layer 111 and a lower surface 220a of a via metal layer 220. That is, the capping film 140 may be exposed by a lower surface 220a of a via metal layer 220. In some embodiments, the capping film 140 may contact the via metal layer 220, as illustrated in FIG. 11.

An upper barrier film 202 may be disposed along a bottom surface of the recess 230, a lower sidewall 230a of the recess 230, an upper sidewall 230b of the recess 230, and the upper surface of the third insulating film 170. The via metal layer 220 may be disposed on the upper barrier film 202 to fill the recess 230. In addition, a first upper metal layer 231 may be formed on the via metal layer 220 and the upper barrier film 202 formed on the upper surface of the third insulating film 170.

Hereinbelow, a semiconductor device according to some embodiments will be described with reference to FIG. 12. Differences from the semiconductor device illustrated in FIG. 2 will be highlighted.

Figure 12:
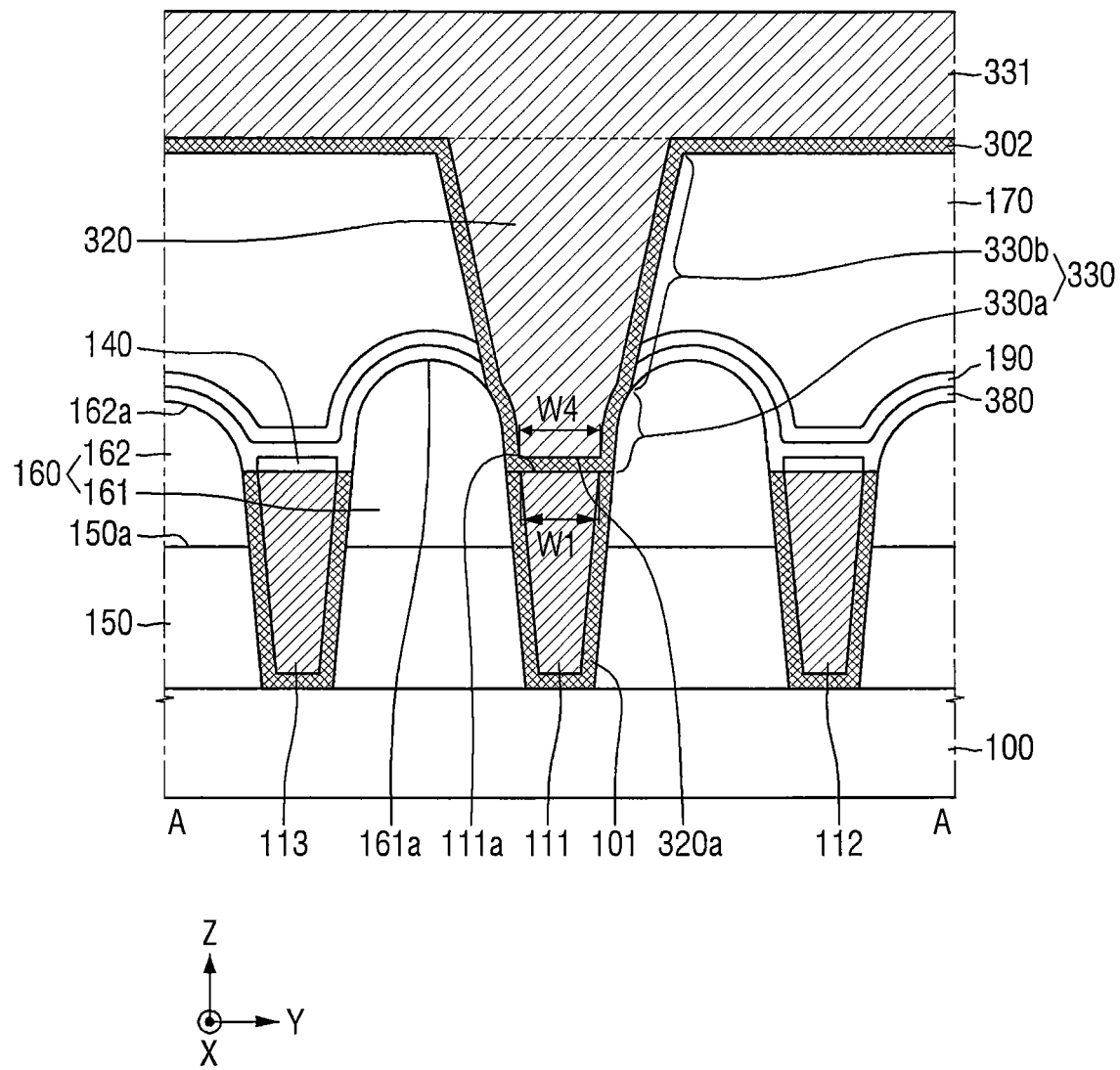
FIG. 12 is a cross-sectional view provided to explain a semiconductor device according to example embodiments of the present inventive concepts.

FIG. 12 is a cross-sectional view provided to explain a semiconductor device according to some embodiments.

Referring to FIG. 12, in the semiconductor device according to some embodiments, an upper barrier film 302 may be directly in contact with the second insulating film 160 by etching a barrier dielectric film 380 at the recess 330 forming process (e.g., while forming the recess 330).

A portion of the second insulating film 160 may be disposed to be dented inward the recess 330. The second insulating film 160 may be exposed to a lower sidewall 330a of the recess 330, and a side surface of the barrier dielectric film 380 may be exposed to an upper sidewall 330b of the recess 330. In some embodiments, as illustrated in FIG. 12, the recess 330 may expose a portion of the second insulating film 160 defining a lower sidewall 330a of the recess 330, and the recess 330 may also expose portions of the adhesive film 190 and the barrier dielectric film 380 that define an upper sidewall 330b of the recess 330.

The width W1 of the upper surface 111a of the first lower metal layer 111 in the second direction Y may be the same as a width W4 of a lower surface 320a of a via metal layer 320 in the second direction Y. However, the inventive concepts of the present disclosure are not limited thereto.

A first upper metal layer 331 may be formed on the via metal layer 320 and the upper barrier film 302 formed on the upper surface of the third insulating film 170.

Hereinbelow, a semiconductor device according to some embodiments will be described with reference to FIG. 13. The differences from the semiconductor device illustrated in FIG. 2 will be highlighted.

Figure 13:
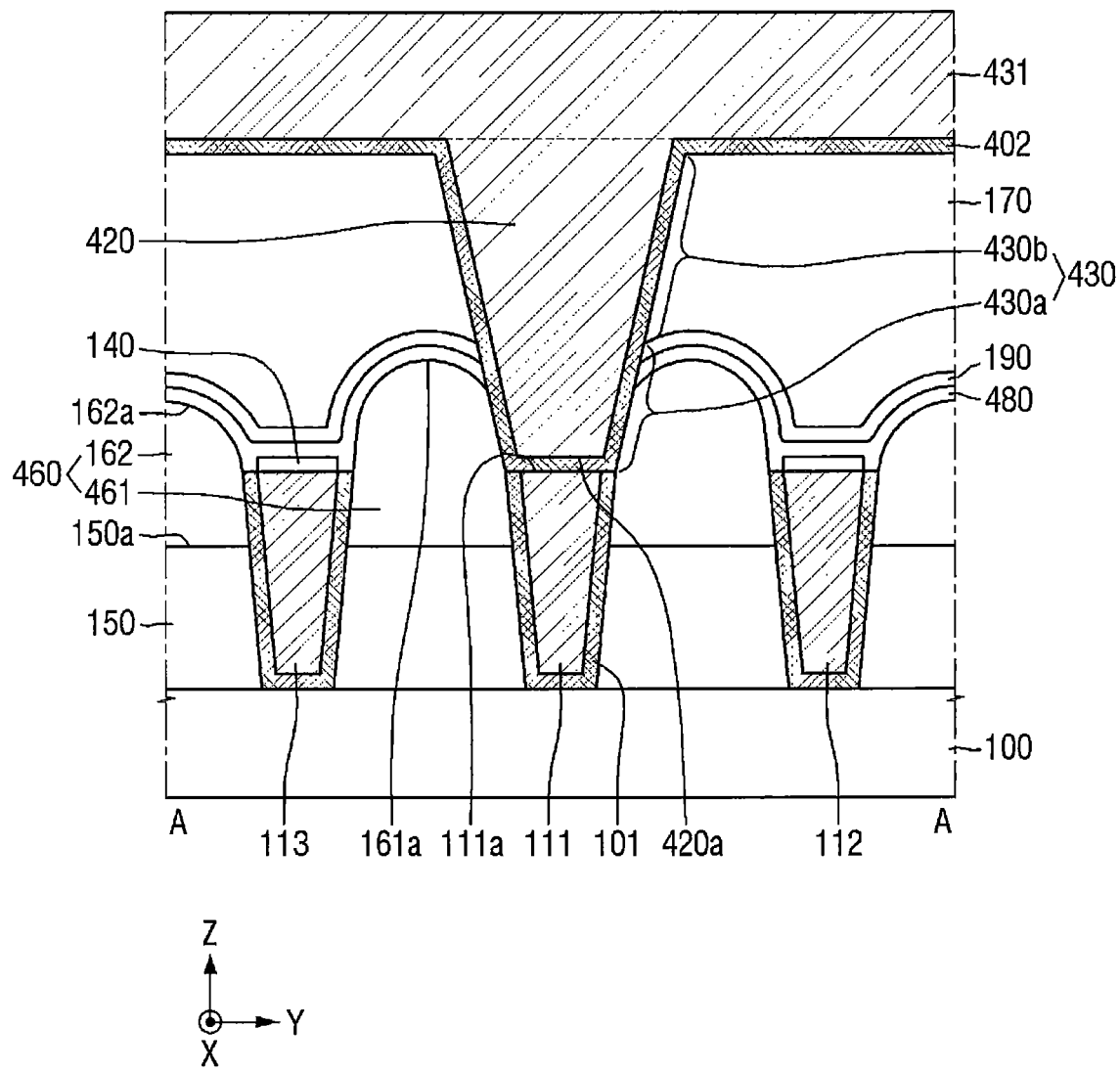
FIG. 13 is a cross-sectional view provided to explain a semiconductor device according to example embodiments of the present inventive concepts.

FIG. 13 is a cross-sectional view provided to explain a semiconductor device according to some embodiments.

Referring to FIG. 13, in the semiconductor device according to some embodiments, a portion of a barrier dielectric film 480 and a portion of a first portion 461 of a second insulating film 460 may be etched at the recess 430 forming process (e.g., while forming the recess 430). To this end, an upper sidewall 430b and a lower sidewall 430a of the recess 430 may have the same inclined profiles as each other.

An upper barrier film 402 may be disposed along a bottom surface of the recess 430, the lower sidewall 430a of the recess 430, the upper sidewall 430b of the recess 430, and the upper surface of the third insulating film 170. A via metal layer 420 may be disposed on the upper barrier film 402 to be in or to fill the recess 430. In addition, a first upper metal layer 431 may be formed on the via metal layer 420 and the upper barrier film 402 formed on the upper surface of the third insulating film 170. In some embodiments, as illustrated in FIG. 13, the lower sidewall 430a of the recess 430 and the upper sidewall 430b of the recess 430 may be coplanar and may form a straight line.

A lower surface 420a of the via metal layer 420 may be wider than the width of the lower surface 120a of the via metal layer 120 in the second direction Y, as shown in FIG. 2.

Hereinbelow, a semiconductor device according to some embodiments will be described with reference to FIG. 14. Differences from the semiconductor device illustrated in FIG. 2 will be highlighted.

Figure 14:
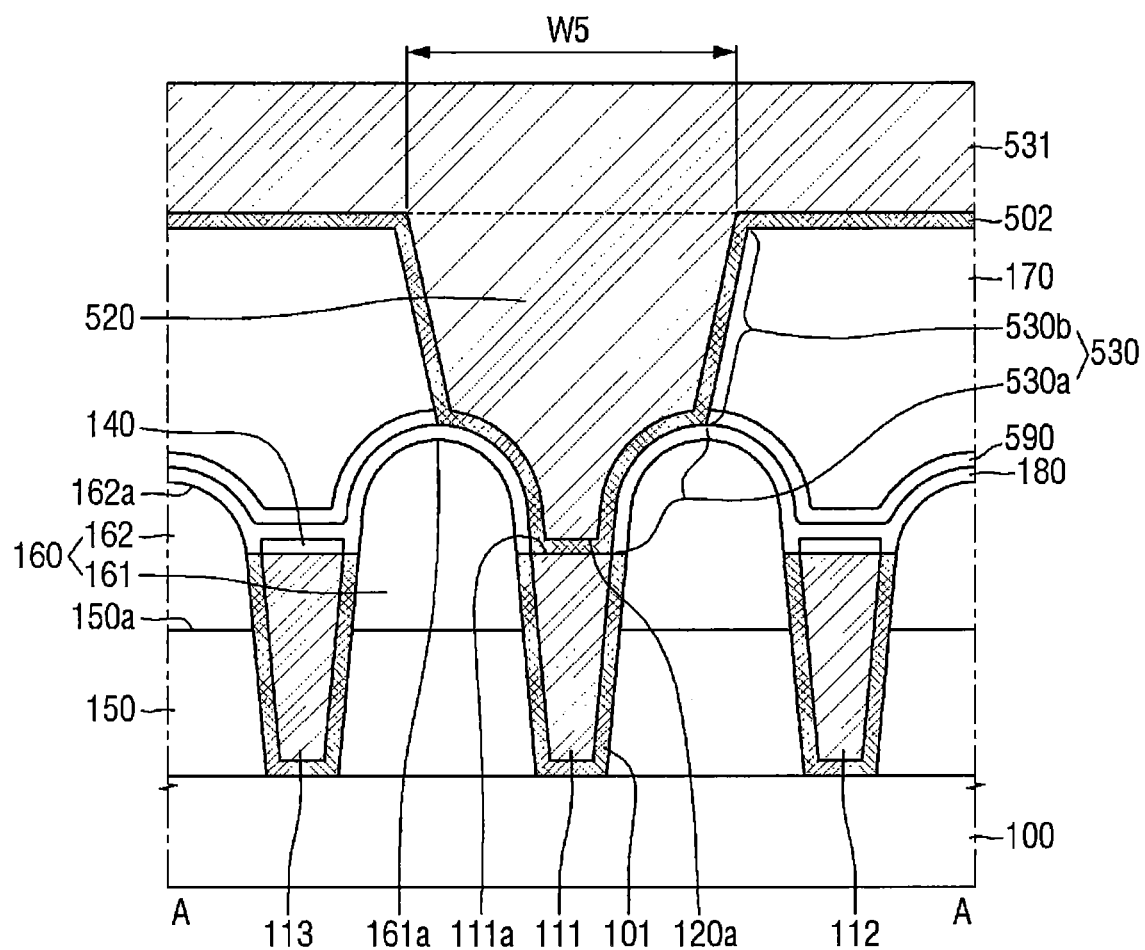
FIG. 14 is a cross-sectional view provided to explain a semiconductor device according to example embodiments of the present inventive concepts.

FIG. 14 is a cross-sectional view provided to explain a semiconductor device according to some embodiments.

Referring to FIG. 14, in the semiconductor device according to some embodiments, a width W5 of an upper surface of a via metal layer 520 in the second direction Y may be greater than the width W3 of the upper surface of the via metal layer 120 in the second direction Y, shown in FIG. 2. That is, an extension line of an inclined profile of an upper sidewall 530b of the recess 530 may not intersect with an extension line of an inclined profile of the sidewall of the first lower metal layer 111.

A lower sidewall 530a of the recess 530 may be formed to be further dented inward the recess 530 than the lower sidewall 130a of the recess 130 illustrated in FIG. 2.

A side surface of an adhesive film 590 may be exposed to the upper sidewall 530b of the recess 530. The adhesive film 590 may be further etched than the adhesive film 190 as illustrated in FIG. 2.

An upper barrier film 502 may be disposed along a bottom surface of the recess 530, the lower sidewall 530a of the recess 530, the upper sidewall 530b of the recess 530, and the upper surface of the third insulating film 170. A via metal layer 520 may be disposed on the upper barrier film 502 to be in or to fill the recess 530. In addition, a first upper metal layer 531 may be formed on the via metal layer 520 and the upper barrier film 502 formed on the upper surface of the third insulating film 170.

Hereinbelow, a semiconductor device according to some embodiments will be described with reference to FIG. 15. Differences from the semiconductor device illustrated in FIG. 2 will be highlighted.

Figure 15:
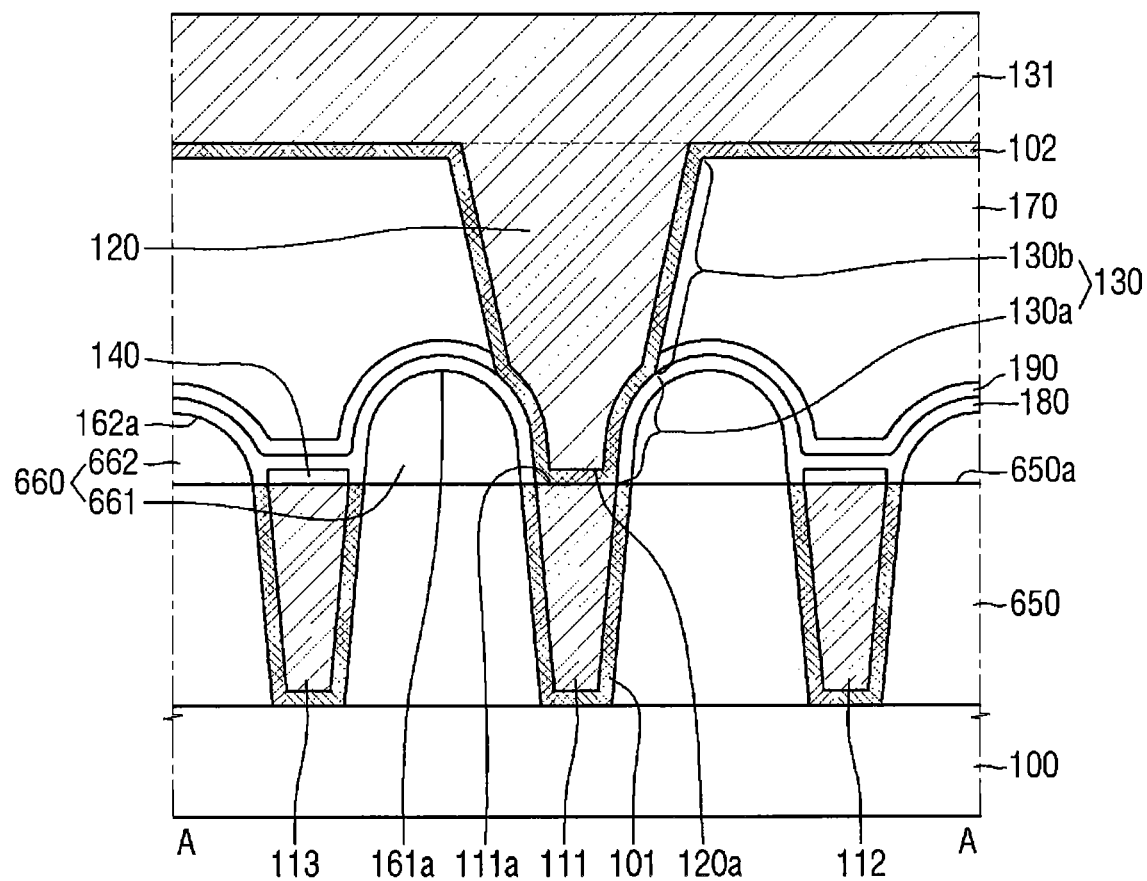
FIG. 15 is a cross-sectional view provided to explain a semiconductor device according to example embodiments of the present inventive concepts.
Figure 15:
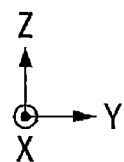

FIG. 15 is a cross-sectional view provided to explain a semiconductor device according to some embodiments.

Referring to FIG. 15, in the semiconductor device according to some embodiments, the upper surface 111a of each of the first to third lower metal layers 111, 112, 113 and an upper surface 650a of a first insulating film 650 may be coplanar with each other.

That is, a lower surface of each of a first portion 661 of a second insulating film 660 and a second portion 662 of the second insulating film 660 may be formed to be coplanar with the upper surface 111a of each of the first to third lower metal layers 111, 112, 113.

Example embodiments according to the inventive concepts of the present disclosure were explained herein with reference to the drawings attached, but it should be understood that the present disclosure is not limited to the aforementioned embodiments. The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a substrate;
    a first insulating film on the substrate;
    a lower metal layer in the first insulating film;
    a second insulating film on the first insulating film, wherein the lower metal layer is in the second insulating film, the second insulating film comprises a lower surface facing the substrate and an upper surface that is opposite the lower surface, and the upper surface of the second insulating film is upwardly convex;
    a barrier dielectric film on the second insulating film, wherein the barrier dielectric film comprises a recess; and
    a via metal layer in the recess of the barrier dielectric film and electrically connected with the lower metal layer,
    wherein the barrier dielectric film extends on a side of a portion of the via metal layer,
    wherein the first insulating film and the second insulating film are sequentially stacked on the substrate in a vertical direction, and
    wherein a longest vertical distance between an upper surface of the lower metal layer and the substrate is less than a longest vertical distance between the upper surface of the second insulating film and the substrate.

2. The semiconductor device of claim 1, wherein the barrier dielectric film comprises:
    a first etching stop film on the second insulating film; and
    an oxidation inhibition film on the first etching stop film.

3. The semiconductor device of claim 2, wherein the barrier dielectric film further comprises a second etching stop film on the oxidation inhibition film.

4. The semiconductor device of claim 1, further comprising a third insulating film on the barrier dielectric film,
    wherein the via metal layer is in the third insulating film.

5. The semiconductor device of claim 4, further comprising an adhesive film between the barrier dielectric film and the third insulating film.

6. The semiconductor device of claim 4, wherein the recess of the barrier dielectric film comprises a lower portion of the recess,
    wherein the third insulating film comprises an upper portion of the recess, and wherein a side of a portion of the third insulating film defining the upper portion of the recess has a profile different from a profile of a side of a portion of the barrier dielectric film defining the lower portion of the recess.

7. The semiconductor device of claim 1, wherein a portion of the barrier dielectric film comprises a curved surface defining the recess, and
wherein the curved surface of the portion of the barrier dielectric film is convex toward the recess.

8. The semiconductor device of claim 1, wherein a portion of the second insulating film comprises a curved surface facing the recess, and
wherein the curved surface of the portion of the second insulating film is convex toward the recess.

9. The semiconductor device of claim 1, wherein a width of the upper surface of the lower metal layer is equal to a width of a lower surface of the via metal layer.

10. A semiconductor device comprising:
a substrate;
a first insulating film on the substrate;
a first lower metal layer in the first insulating film;
a second lower metal layer in the first insulating film and spaced apart from the first lower metal layer in a horizontal direction, wherein a portion of the first insulating film is between the first lower metal layer and the second lower metal layer, and the first lower metal layer, the second lower metal layer, and the portion of the first insulating film define a recess;
a second insulating film in the recess; and
a via metal layer on the first lower metal layer and electrically connected with the first lower metal layer,
wherein a longest vertical distance between an upper surface of each of the first and second lower metal layers and the substrate is less than a longest vertical distance between an upper surface of the second insulating film and the substrate, and
wherein the second insulating film does not overlap the upper surface of the first lower metal layer and the upper surface of the second lower metal layer.

11. The semiconductor device of claim 10, wherein the second insulating film comprises a lower surface facing the substrate and the upper surface that is opposite the lower surface, and
wherein the upper surface of the second insulating film is upwardly convex.

12. The semiconductor device of claim 10, wherein the second insulating film comprises a plurality of second insulating films comprising:
a first one of the plurality of second insulating films in the recess portion on a first side of the second lower metal layer that faces the first lower metal layer and defines the recess; and
a second one of the plurality of second insulating films on a second side of the second lower metal layer opposite the first side of the second lower metal layer,
wherein an upper surface of the second one of the plurality of second insulating films is closer to the substrate than an upper surface of the first one of the plurality of second insulating films.

13. The semiconductor device of claim 10, further comprising a barrier dielectric film extending conformally on the second insulating film.

14. The semiconductor device of claim 13, further comprising:
a third insulating film on the barrier dielectric film, wherein a portion of the third insulating film extends on a side of the via metal layer; and
an adhesive layer between the barrier dielectric film and the third insulating film.

15. The semiconductor device of claim 10, wherein the longest vertical distance between the upper surface of the second insulating film and the substrate is less than a longest vertical distance between an upper surface of the via metal layer and the substrate.

16. A semiconductor device comprising:
a substrate;
a first insulating film on the substrate;
a lower metal layer in the first insulating film;
a second insulating film on the first insulating film, wherein the second insulating film comprises a lower surface facing the substrate and an upper surface that is opposite the lower surface, and the upper surface of the second insulating film is upwardly convex;
a barrier dielectric film on the second insulating film;
a third insulating film on the barrier dielectric film, wherein the third insulating film comprises a recess; and
a via metal layer in the recess of the third insulating film and electrically connected with the lower metal layer,
wherein the first insulating film and the second insulating film are sequentially stacked on the substrate in a vertical direction, and
wherein a longest vertical distance between an upper surface of the lower metal layer and the substrate is less than a longest vertical distance between the upper surface of the second insulating film and the substrate.

17. The semiconductor device of claim 16, wherein the upper surface of the lower metal layer is coplanar with an upper surface of the first insulating film.

18. The semiconductor device of claim 16, wherein a portion of the second insulating film comprises a curved surface facing the recess, and
wherein the curved surface of the portion of the second insulating film is convex toward the recess.

19. The semiconductor device of claim 16, wherein the barrier dielectric film comprises:
a first etching stop film on the second insulating film;
an oxidation inhibition film on the first etching stop film; and
a second etching stop film on the oxidation inhibition film.

20. The semiconductor device of claim 16, wherein the third insulating film comprises an upper portion of the recess, and the recess further comprises a lower portion between the upper portion of the recess and the substrate, and
a side of the upper portion of the recess and a side of the lower portion of the recess are coplanar.

* * * * *